United States Patent [19]

Shirasaka

[11] 4,450,538
[45] May 22, 1984

[54] ADDRESS ACCESSED MEMORY DEVICE HAVING PARALLEL TO SERIAL CONVERSION

[75] Inventor: Hisatoshi Shirasaka, Tokyo, Japan

[73] Assignee: Tokyo Shibaura Denki Kabushiki Kaisha, Japan

[21] Appl. No.: 346,145

[22] Filed: Feb. 5, 1982

Related U.S. Application Data

[63] Continuation of Ser. No. 102,836, Dec. 12, 1979.

[30] Foreign Application Priority Data

Dec. 23, 1978 [JP] Japan .................................. 53/160706
Dec. 23, 1978 [JP] Japan .................................. 53/160707
Dec. 23, 1978 [JP] Japan .................................. 53/160708

[51] Int. Cl.³ ............................................. G11C 13/00
[52] U.S. Cl. .................................... 365/219; 365/189
[58] Field of Search ............... 365/174, 182, 189, 219, 365/230, 238

[56] References Cited

U.S. PATENT DOCUMENTS 3,560,940 2/1971 Gaensslen .
3,763,480 10/1973 Weimer .
3,863,232 1/1975 Johnson et al. .

Primary Examiner—Terrell W. Fears
Attorney, Agent, or Firm—Finnegan, Henderson, Farabow, Garrett & Dunner

[57] ABSTRACT

A memory device is provided with first and second memories. Two groups of data are loaded into the first and second memories, through a data buffer register. The same address information is applied to the first and second memories and the information is read out from the first and second memories. The two groups of the data read out in parallel are applied to a data multiplexer which in turn converts the parallel information into the serial one.

10 Claims, 45 Drawing Figures

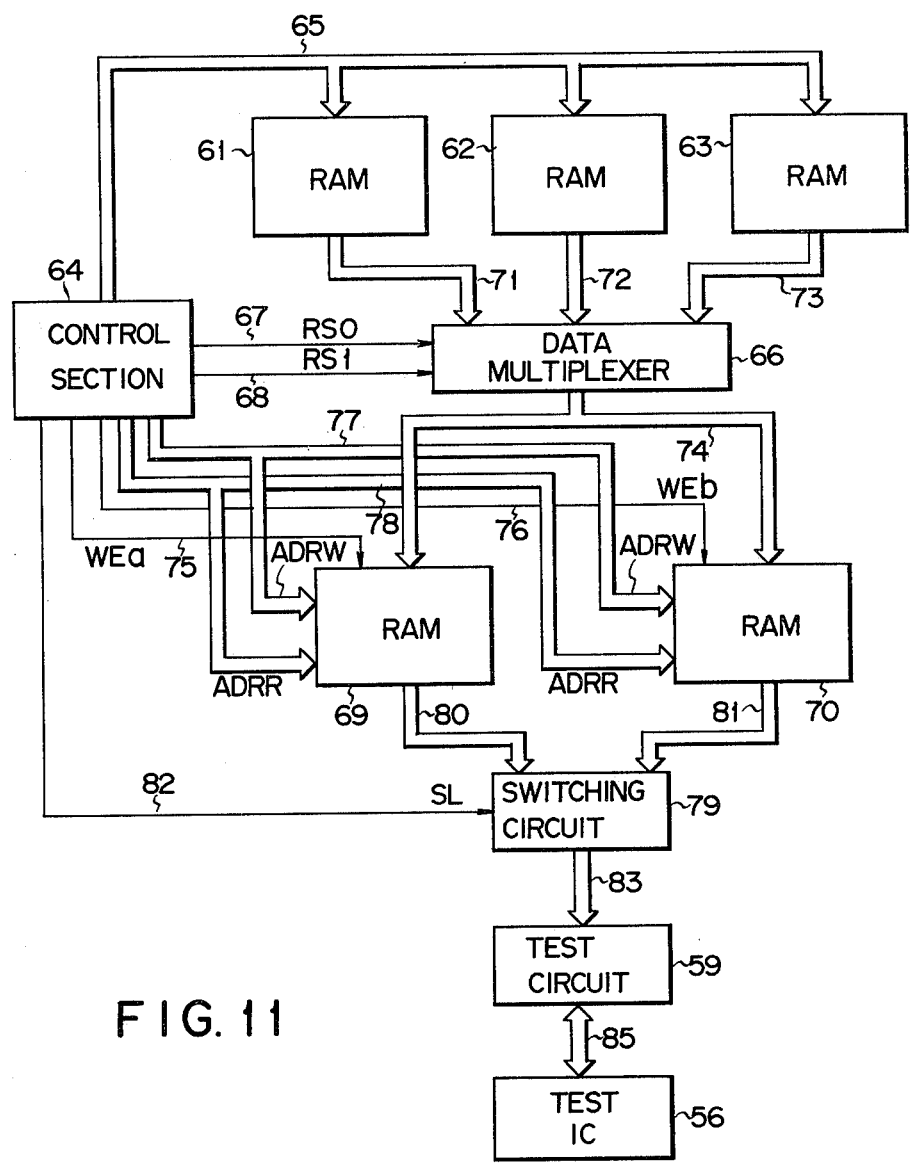
F I G. 11

ADDRESS ACCESSED MEMORY DEVICE HAVING PARALLEL TO SERIAL CONVERSION

This is a continuation of application Ser. No. 102,836, filed Dec. 12, 1979.

BACKGROUND OF THE INVENTION

The present invention relates to a memory device with a reduced cycle time.

Generally, a memory device can not operate at a higher speed than that specified by the cycle time. Accordingly, a memory device used in a system which must be operated at a high speed, must have a shortened cycle time. A memory device with shortened cycle time is expensive, however.

SUMMARY OF THE INVENTION

An object of the invention is to provide a memory device with a substantially shortened cycle time and a low manufacturing cost.

In order to achieve the above object, there is provided a memory device for receiving, storing and outputting data groups, said memory device comprising a plurality of registers, each of the registers for receiving and storing a data group and for outputting the stored group following the storing thereof, a plurality of memory means for addressably storing and outputting data groups, each of said memory means being associated with a different one of the registers for receiving data groups outputted by the associated register, address control means for supplying in parallel the same address information to each of the memory means to cause each of the memory means to output the data groups stored in the supplied address, and parallel-to-serial converting means coupled to the plurality of memory means for receiving the data groups outputted from said memory means and for selectively supplying serially said receiving data groups.

The invention will be better understood from the following description taken in connection with the accompanying drawings.

BRIEF DESCRIPTION OF THE DRAWINGS

FIG. 11 shows a block diagram when the memory device according to the invention is applied for the IC tester;

DETAILED DESCRIPTION OF THE PREFERRED EMBODIMENTS

Figure 1:
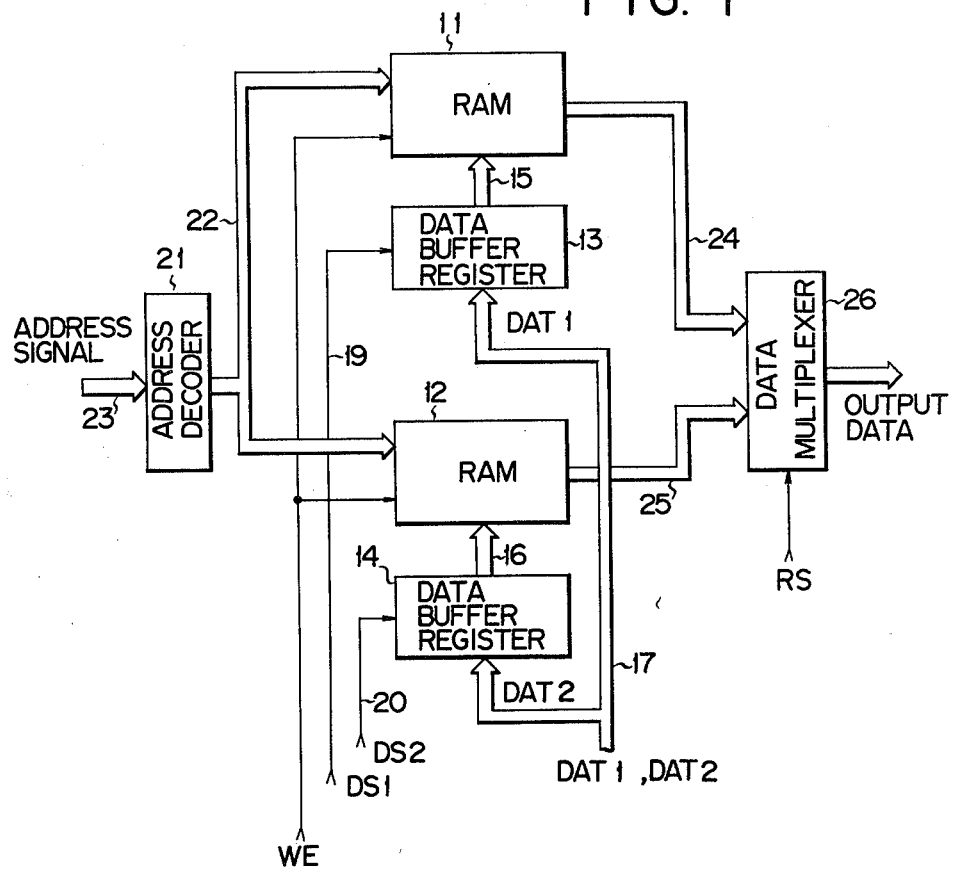
FIG. 1 shows a block diagram of a memory device which is an embodiment according to the invention.

FIG. 1 shows a block diagram of an embodiment of a memory device according to the invention. In this figure, the memory device according to the invention includes first and second memories 11 and 12. The first and second memories 11 and 12 are connected to data buffer registers 13 and 14 through data buses 15 and 16, respectively. The first and second memories 11 and 12 are comprised of random access memories, for example. Model I2147, manufactured by INTEL Corp. now marketed, for example, is suitable for the memories. Random access memories comprise arrays of storage cells that memorize information in binary form, which information can be randomly written into or read out of each storage element as required.

For the first memory 11, data DAT1, for example, is applied to the first buffer register 13 through an input data bus 17. For the second memory 12, data DAT2, for example, is supplied to the data buffer register 14 through the input data bus 17. The first and second data buffer registers 13 and 14 also receive data set signals DS1 and DS2 through control lines 19 and 20 in synchronism with the transmission timings of the data DAT1 and DAT2, respectively. Upon receipt of the data set signals DS1 and DS2, the data buffer registers 13 and 14 store the data DAT1 and DAT2 and supply the data DAT1 and DAT2 to the first and second memories 11 and 12.

The first and second memories 11 and 12 are connected to an address decoder 21 through an address bus 22. The address decoder decodes an address signal supplied through the data bus 23 and supplies the decoded address signal to the memories 11 and 12. Accordingly, the same address information is supplied to the first and second memories 11 and 12.

When a write enable signal WE is supplied to the first and second memories 11 and 12, the data outputted from the first and second data buffer registers 13 and 14 are loaded into the memory locations specified by the address information. When the first and second memories 11 and 12 are addressed after the data are stored therein, the stored data are read out from the first and the second memories. The data read out from the first and second memories 11 and 12 are applied in parallel through data buses 24 and 25 into the data multiplexer 26. The data multiplexer 26 is so designed that, during a period that the read select signal RS inputted is in a high level, the data coming through the data bus 24 is selected and, when the signal RS is inverted from high level to low level, the data coming through the data bus 25 is selected. The data multiplexer 26 thus serves as a parallel-to-serial converter for converting two parallel data into serial data.

The read and write operations of data in the memory device thus constructed will be described. The address signals are sequentially inputted into the address decoder 21. Upon receipt of the first address signal, the address decoder 21 decodes the address signal and produces the address data corresponding to the address signal for a period $t_{wc}$ shown in FIG. 2A. The address data is inputted through the address bus 22 into the first and second memories 11 and 12. The address data specifies the same memory locations in the first and second memories 11 and 12.

Figure 2:
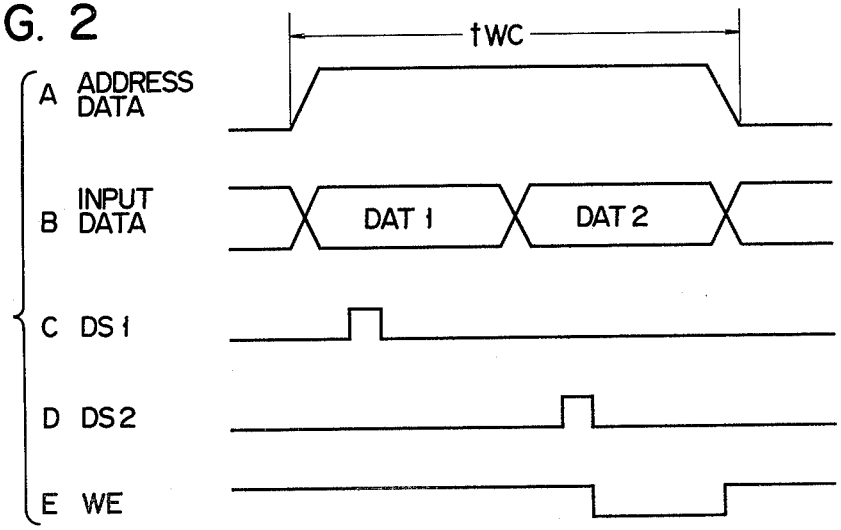
FIG. 2, consisting of A-E, shows a set of timing charts useful in explaining the write operation of an embodiment shown in FIG. 1.

During a portion of a period for outputting the address data, two groups of data DAT1 and DAT2 are serially and alternately transferred into the input data bus 17, as shown in FIG. 2B. During a period that the data DAT1 is transferred into the input data bus 17, a data set pulse DS1 of a high level is inputted into the data buffer register 13. In response to the data set pulse DS1, the data buffer register 13 stores the data DAT1 and then outputs the same to the first memory 11. During the succeeding period, the data DAT2 is transferred into the input data bus 17, and a data set pulse DS2 of a high level is inputted into the data buffer register 14. In response to the data set pulse DS2, the data buffer register 14 stores the data DAT2 and supplies the same to the second memory 12.

Then, a write enable signal WE of low level is inputted into the first and second memories 11 and 12. Upon receipt of the write enable signal WE, the data DAT1 and DAT2 supplied from the data buffer registers 13 and 14 are stored in the address locations specified by the address decoder 21. Accordingly, the memories 11 and 12 store the data DAT1 and DAT2, respectively. Subsequently, the inputting of the address signals and the sequential transferring of the data DAT1 and DAT2 cooperate to write the data DAT1 and DAT2 into the corresponding memory locations of the memories 11 and 12 specified.

In the write operation of the memory device of FIG. 1, the write cycle time $t_{wc}$, i.e. a time from an instant that the address data is outputted until the first and second memories 11 and 12 complete the storing of the data DAT1 and DAT2, is longer than that of a conventional memory device by an amount equal to the holding time of the data in the data buffer registers 13 and 14. Compared to the time from an instant that the address signal is inputted until the address data is inputted to the first and second memories 11 and 12, the time taken for the data DAT1 and DAT2 to be loaded into the first and second memories 11 and 12 through the data buffer registers 13 and 14 is much shorter because decoding of the data is not necessary.

In this embodiment, the write cycle time $t_{wc}$ is substantially equal to that taken for a conventional memory to store data one time. Further, this embodiment stores twice as much data for each write cycle time as the amount written by a conventional memory device. Therefore, the write cycle time of the memory device according to the invention is substantially two times that of a conventional memory, if the write cycle time of each memory 11 and 12 is equal to that of a conventional memory.

Figure 3:
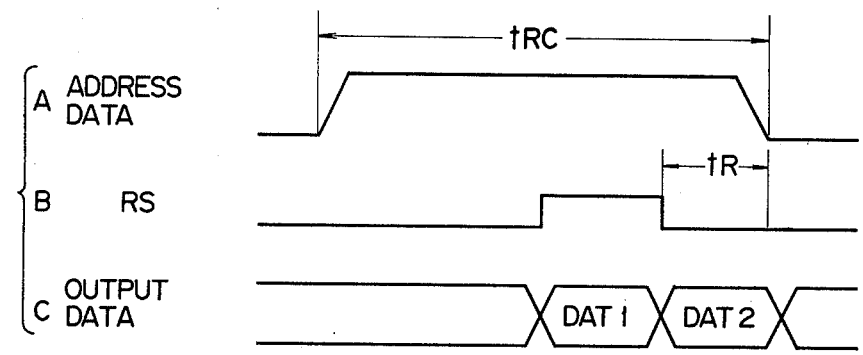
FIG. 3, consisting of A-C, shows a set of timing charts useful in explaining the read operation of an embodiment shown in FIG. 1.

The read operation of the memory device under discussion will be described. A signal corresponding to a desired address data is inputted to the address decoder 21. The address decoder 21 decodes the address data signal and produces address data corresponding to the address signal for a period $t_{rc}$ shown in FIG. 3A. The address data is transferred through the address bus 22 to the first and the second memories 11 and 12. The memories 11 and 12 produce in parallel the two groups of data DAT1 and DAT2 stored in the memory locations specified by the address. The data DAT1 and DAT2 are read out in parallel from the memories 11 and 12 and are inputted in parallel into the data multiplexer 26 through the data buses 24 and 25. As the read select signal RS becomes a high level, the data multiplexer 26 selects the data DAT1 coming through the data bus 24. Then, as the read select signal RS inverts its level from high to low, the multiplexer 26 selects the data DAT2 coming through the output data bus 25. Therefore, the data multiplexer 26 produces the data DAT1 and DAT2 in serial and alternate fashion as shown in FIG. 3C.

Consequently, by inputting a desired address signal into the address decoder 21, the two groups of data DAT1 and DAT2 previously stored in the memories 11 and 12 are read out serially and alternately into the data multiplexer 26.

In a conventional memory device, the read cycle completes within a time obtained by subtracting a time $t_R$ that the data multiplexer 26 produces the data DAT2 from a time $t_{RC}$ that the address data is outputted. The read cycle of the memory device of the invention is longer by time $t_R$ than that of a conventional memory device. However, the memory device according to the invention can read out within one read cycle twice the amount of data that is read out in one cycle by a conventional memory device. Further, the time $t_R$ is much shorter than the time $t_{RC}$. Therefore, the read cycle time of the memory device according to the invention is substantially half of that of a conventional memory device when the read cycle time of each memory 11 and 12 is equal to that of a conventional memory device.

As described above, the effective cycle time of the memory device is considerably shortened even if the cycle time of each memory is relatively longer when compared to a conventional memory. When a memory operable at 5 MHz is used for the memories 11 and 12, the operating speed of the memory device as a whole is 10 MHz which is twice 5 MHz. Accordingly, a memory with a relatively longer cycle time is allowable for embodying the memories 11 and 12, leading to a cost reduction of the memory. The memory with a longer cycle time may have a relatively large memory capacity, so that a memory device with a larger memory capacity may also be readily constructed.

Figure 4:
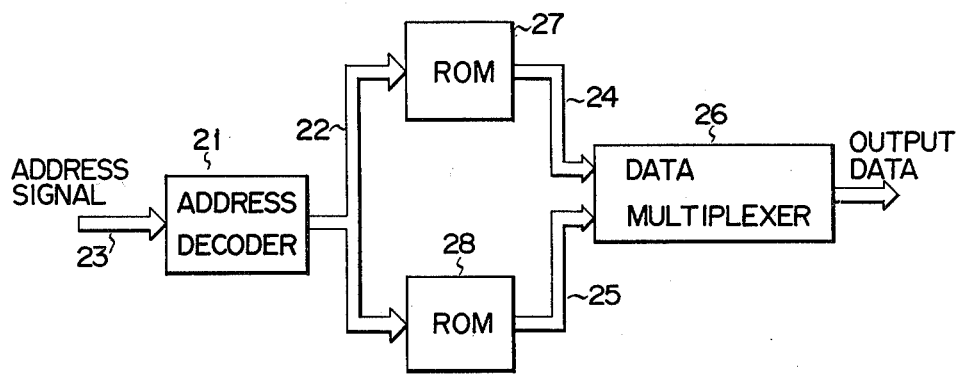
FIG. 4 shows a block diagram of a modification of the embodiment shown in FIG. 1.

Turning now to FIG. 4, there is shown another embodiment of the memory device according to the invention. The difference of this embodiment from the FIG. 1 embodiment is that read only memories 27 and 28 (ROMs) are used for the memories 11 and 12. Read only memories comprise arrays of storage elements that memorize information in binary form, which information can be read out as often as desired but can not be modified without adding or subtracting storage elements. In this case, since data is previously stored in the read only memories 27 and 28, there is no need for the input data bus 17 and the data buffer registers 13 and 14. In this embodiment, the data is only read out from the memories 27 and 28, so that the read cycle time is shortened to be about half of that of a conventional ROM.

Figure 5:
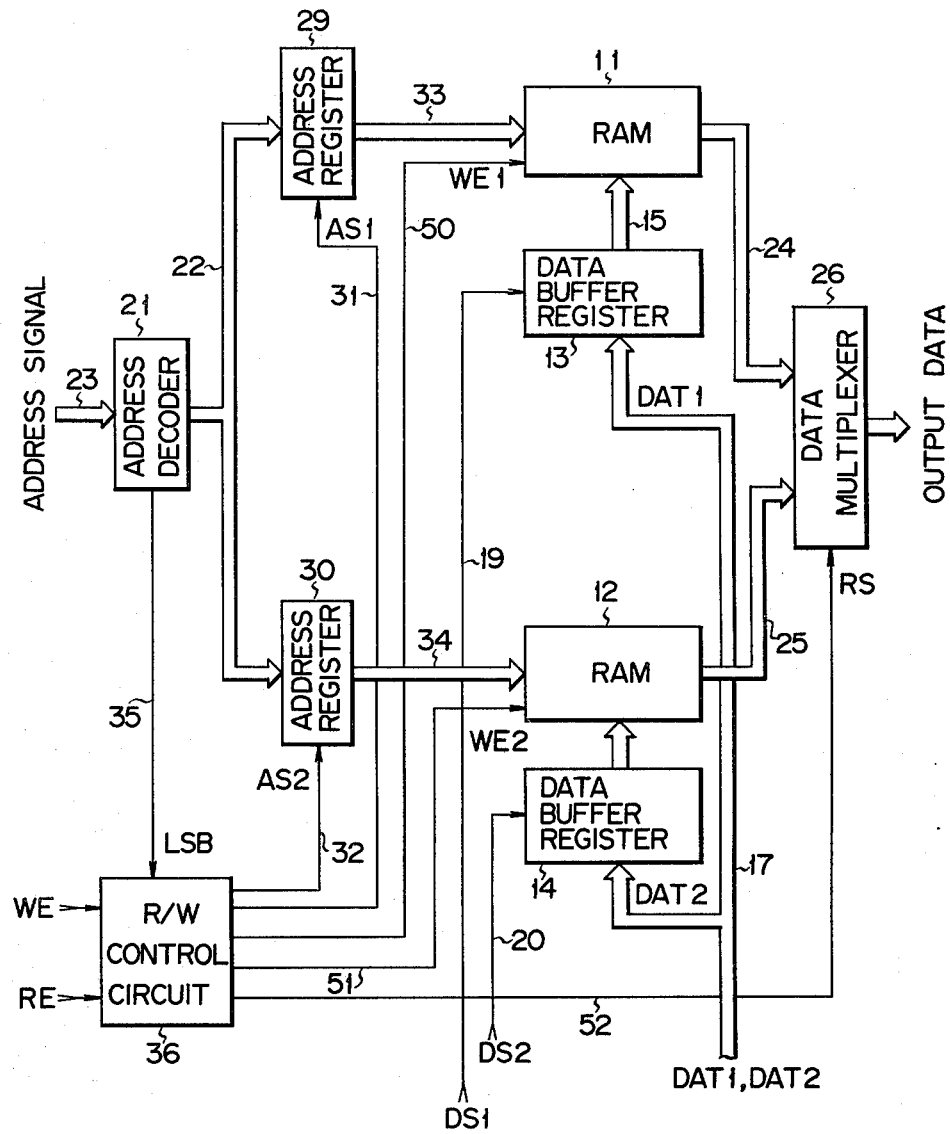
FIG. 5 shows a block diagram of another embodiment of the memory device according to the invention.

In FIG. 5, there is shown still another embodiment of the memory device according to the invention. In this figure, like numerals are used to designate components like or equivalent to the preceding figures. As shown, the output of the address decoder 21 is coupled through the data bus 22 to first and second address registers 29 and 30. Address set pulses AS1 and AS2 are applied through control lines 31 and 32 to the address registers 29 and 30, respectively. When the address set pulses AS1 and AS2 are applied to the address registers 29 and 30, the address data from the address decoder 21 is loaded into the address registers 29 and 30. Then, the contents of the address registers 29 and 30 are supplied through the data buses 33 and 34 to the first and the second memories 11 and 12, respectively. The address decoder 21 also transfers the least significant bit (LSB) of the address data decoded through the control line 35 to a read/write control circuit 36. The read/write control circuit 36 is constructed as shown in FIG. 6, for example.

Figure 6:
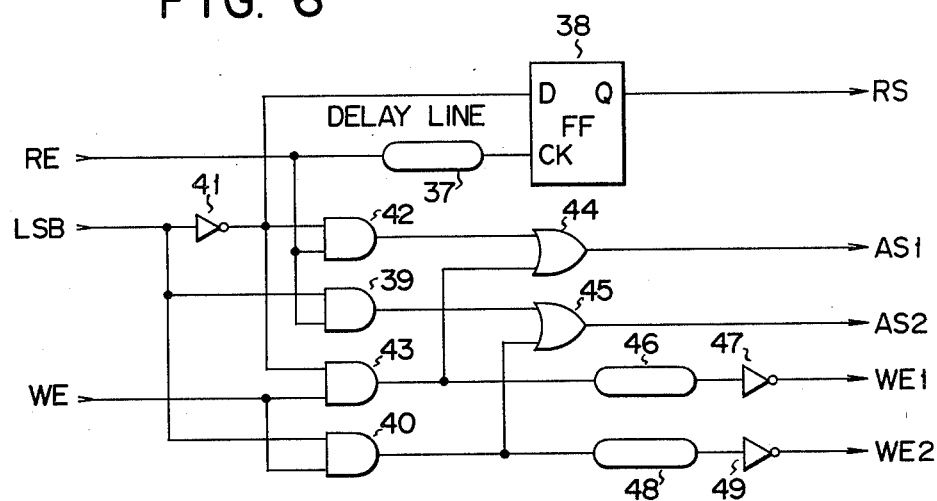
FIG. 6 shows a circuit diagram of a read/write control circuit of the embodiment shown in FIG. 5.

As shown, in FIG. 6 a read enable signal (RE) is supplied to the clock input terminal of a D-type flip-flop 38 by way of a delay line 37. The LS3 signal is applied to one of the input terminals of each AND circuit 39 and 40. The LSB signal is inverted by an inverter 41 and the inverted signal is then transferred to one of the input terminals of each AND circuits 42 and also to 43 and the D input terminal of the flip-flop 38. A read enable signal (RE) is applied to the other input terminal of each AND circuit 42 and 39 and a write enable signal (WE) is applied to the other input terminals of the AND circuits 43 and 40.

The output signals from the AND circuits 42 and 43 are transferred to an OR circuit 44 which in turn produces the address set signal AS1. The output signals of the AND gates 39 and 40 are applied to an OR circuit 45 which in turn produces the address set signal AS2. The output signal from the AND circuit 43 is transformed into a first write enable signal (WE1) through a delay line 46 and an inverter 47. The output signal from the AND circuit 40 is transformed into a second write enable signal (WE2) through a delay line 48 and an inverter 49. The flip-flop 38 produces at the output terminal Q the read select signal RS.

When the address data is even address data, the LSB signal is low in level. In this case, a signal of a high level is applied to the AND circuits 42 and 43, through the inverter 41. In the read mode, the read enable signal RE of a high level is applied to the other input terminal of the AND gate 42. In the write mode, a write enable signal WE of a high level is applied to the other input terminal of the AND circuit 43. Accordingly, the signal of a high level is applied from either the AND circuit 42 or the AND circuit 43 to the OR circuit 44, so that the OR circuit 44 produces an address set signal AS1.

In the case of an odd address data, the LSB signal is a high level and therefore a high level signal is applied to the AND circuits 39 and 40. Accordingly, in either the read mode or the write mode, either the AND circuit 39 or the AND circuit 40 applies a high level signal to the OR circuit which produces therefore address set signal AS2.

When receiving the write enable signal WE, the control circuit 36 produces the write enable signal WE1 through the AND circuit 43, the delay line 46, and the inverter 47, in the case of the even address. On the other hand, in the case of the odd address, it produces the write enable signal WE2 through the AND circuit 40, the delay line 48, and the inverter 49. The address set signal AS1 produced from the control circuit 36 is applied through the control line 31 to the address register 29; the set signal AS2 produced from the control circuit 36 is applied through the control line 32 to the address register 30; the write enable signal WE1 produced from the control circuit 36 is applied through the control line 50 to the first memory 11; the write enable signal WE2 produced from the control circuit 36 is applied through the control line 51 to the second memory 12; the read select signal RS produced from the control circuit 36 is applied through the control line 52 to the data multiplexer 26.

The even address of the address data produced from the address decoder 21 is held in the address register 29 and the odd address is held in the address register 30. The address data outputted from the address register 29 and the address register 30 are inputted in parallel to the memories 11 and 12. The even address is assigned to the memory 11 while the odd address in assigned to the memory 12. The memories 11 and 12 store the data outputted from the data buffer registers 13 and 14 in the memory locations on the basis of the address information.

The control of the reading operations from the memories 11 and 12 is the same as that mentioned in the FIG. 1 embodiment, and therefore the explanation thereof will be omitted.

Figure 7:
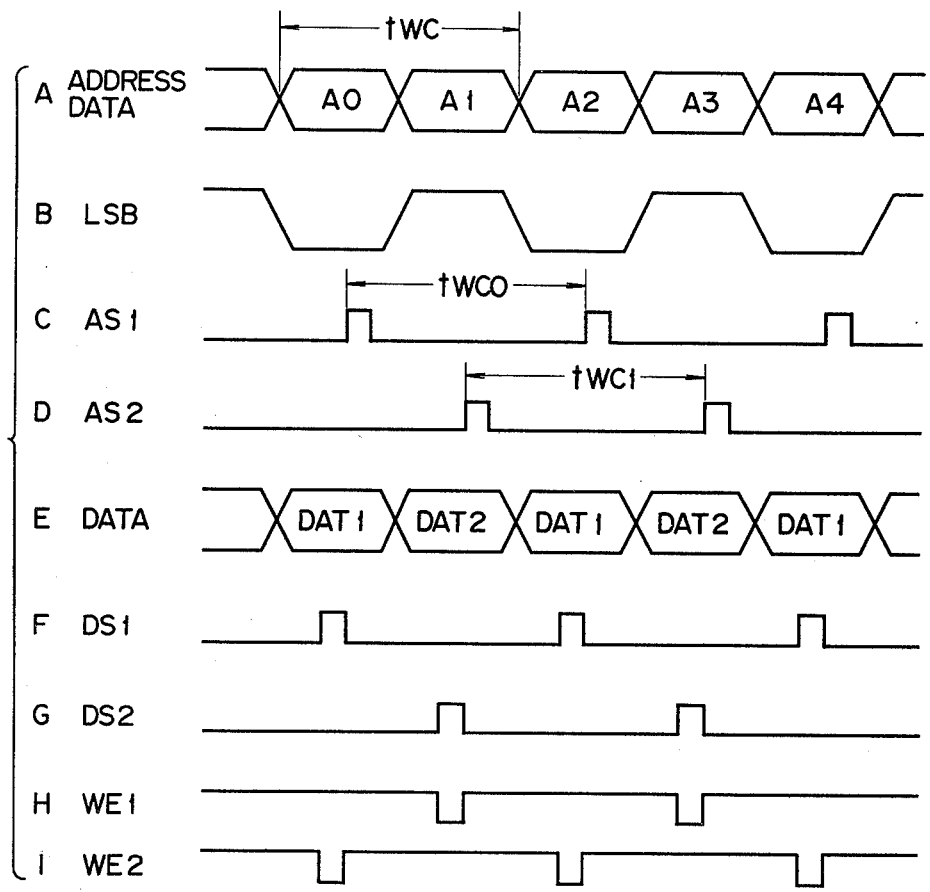
FIG. 7, consisting of A-I, shows timing charts useful in explaining the write operation of the embodiment shown in FIG. 6.

The sequential writing of data into the memories 11 and 12 in the memory device of the FIG. 5 embodiment will be described. Address signals are successively inputted into the address decoder 21. At this time, the address signal is inputted twice into the address decoder 21 during the write cycle $t_{wc}$, as shown in FIG. 7A. For example, the 0th address signal is first inputted. Upon receipt of the signal, the address decoder 21 decodes the address signal to produce an address data to specify the 0th address. Since the address data is the even address, the least significant bit signal LSB of the address data $A_0$ outputted from the address decoder 21 becomes low in level, as shown in FIG. 7B. Accordingly, the read/write control circuit 36 produces an address set pulse AS1 of a high level as shown in FIG. 7C. After the address set pulse AS1 is inputted, the address register 29 stores the address data $A_0$ of the even address data. After storing the address data $A_0$, the address register 29 specifies the address 0 or the 0th address of the memory 11.

In the mid-point of the cycle time $t_{wc}$, the address decoder 21 decodes the address signal to produce an address data $A_1$ to specify the 1st address or the address 1. If the address data $A_1$ is the odd address data, the signal LSB produced from the address decoder 21 is inverted in level to be a high value, as shown in FIG. 7B. Accordingly, the read/write control circuit 36 produces an address set pulse of high level as shown in FIG. 7D. After the address set pulse AS2 is inputted to the address register 30, the address register stores the odd address data $A_1$. Accordingly, after the storage of the address data, the address register 30 specifies the address 1 of the memory. Then, the address decoder 21 decodes the address signals to produce address data $A_2$, $A_3$, ... to specify the address 2, address 3, ... while at the same time the address register 29 successively stores the even addresses outputted from the address decoder 21 to specify the addresses of the memory 11. The address register 30 stores the odd addresses outputted from the address decoder 21 to designate the addresses in the memory 12.

When the even address data and the odd address data are alternately inputted to the address decoder 21, the read/write control circuit 36 alternately produces the address set pulses AS1 and AS2 during the cycle times $t_{wc}$ in the memories as shown in FIGS. 7C and 7D. As a result, during the cycle time $t_{wc}$, the address decoder 21 produces the address data two times, so that the memories 11 and 12 are alternately addressed by the output signals from the address registers 29 and 30 during the cycle time $t_{wc}$.

The address signal is inputted to the address decoder 5 and, at the same time, two groups of data DAT1 and DAT2 are serially and alternately inputted to the data buffer registers and to the related memories, through the input data bus 17. During a period that the data DAT1 is transferred through the input data bus 17, the data buffer register 13 receives the data set pulse DS1 with high level as shown in FIG. 7F. Upon receipt of the pulse DS1, the data buffer register 13 stores the data DAT1 and then supplies the same RAM 11.

During a period that the data DAT2 is transferred to the input data bus 17, the data set pulse DS2 of a high level, as shown in FIG. 7G, is inputted to the data buffer register 14. In response to the pulse DS2, the data buffer register 14 stores the data DAT2 and then supplies the same to RAM 12. Subsequently, when the data buffer registers 13 and 14 receive the data set signals DS1 and DS2, two groups of data DAT1 and DAT2 are transferred through the input data bus 17 and are supplied to RAMs 11 and 12 during the period $t_{wc}$.

At this time, if the write control signal is inputted into the read/write control circuit 36, the read/write control circuit 36 produces a write enable signal of a low level during a period that the address decoder 21 produces the odd address data ($A_1$, $A_3$, ...). During a period that the address decoder 21 produces the even address data ($A_0$, $A_2$, ...) it produces a write enable signal WE2 of low level, as shown in FIG. 7I.

During a period $t_{wc0}$ that the address 0 is specified, if the write enable signal WE1 is inputted into the memory 11, the memory 11 writes data DAT1 from the data buffer register 13 to the address 0. Further, at the midpoint of the period $t_{wc0}$ that the address 0 of the memory 11 is specified, the address 1 of the other memory 12 is specified. During the period $t_{wc1}$ that the address 1 is specified, if the write control pulse WE2 is inputted to the memory 12, the data buffer register 14 writes the data DAT2 from the data buffer register 14 into the address 1 of the memory 12. Similarly, from the midpoint of the period that the memory 11 is addressed by the even address data $A_2$, $A_4$, ..., the odd address data $A_3$, $A_5$, ... of the memory 12 are successively specified. During the period that the memories 11 and 12 are addressed, the write enable signals WE1 and WE2 are inputted into the memories 11 and 12, which memories successively store the data DAT1 and DAT2, respectively.

In this manner, when the data are continuously stored into the memories, the memories 11 and 12 are addressed during the cycle time $t_{wc}$ and the periods that the memories 11 and 12 are addressed overlap each other at the halves. Therefore, the data may be stored into the two memories during the cycle time $t_{wc}$. Accordingly, the memory device of this embodiment can store twice the amount of data of a conventional memory device which stores the data into one memory during one write cycle time. In this respect, the memory device according to the invention shortens the cycle time to the half, compared to a conventional memory device.

Figure 8:
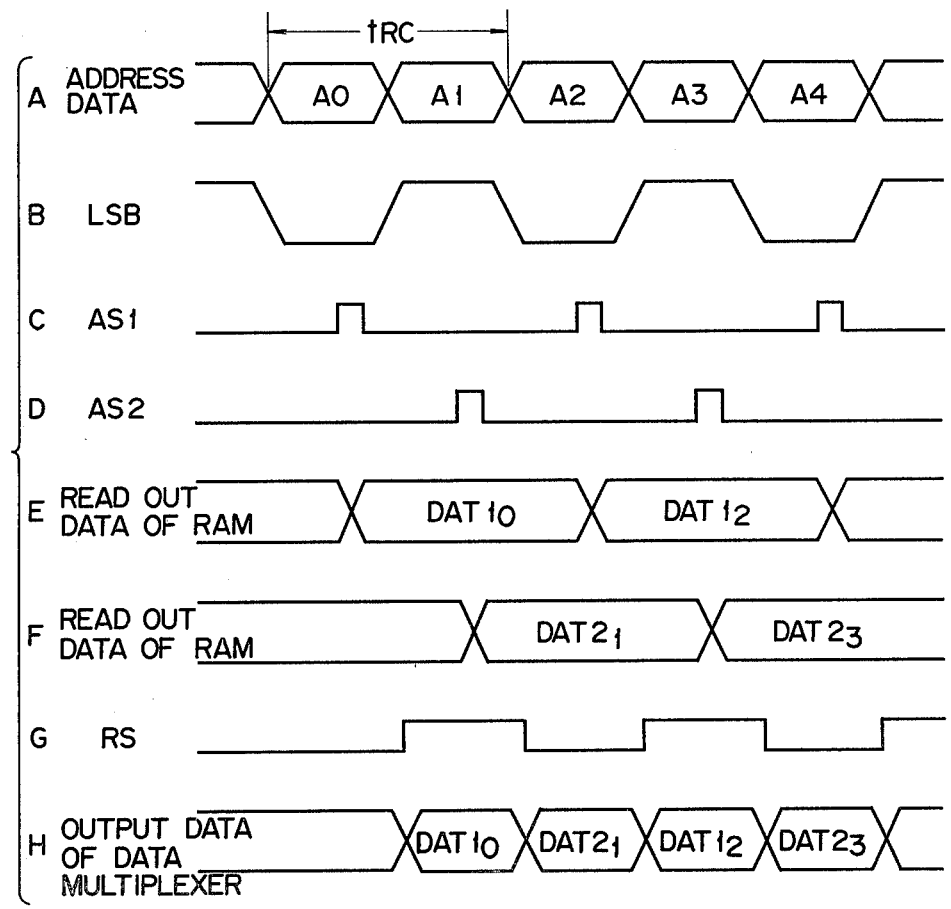
FIG. 8, consisting of A-H, shows timing charts useful in explaining the read operation of the embodiment shown in FIG. 6.

Explanation will be given how to read continuously the data out of the memories 11 and 12. The address signal is successively inputted to the address decoder 21. At this time, the address signal is inputted twice to the address decoder 21 during the read cycle time $t_{RC}$ of the memories 11 and 12. By successively inputting the address signals, the memories 11 and 12 are both addressed during the cycle time $t_{RC}$ as in the write mode, as shown in FIG. 8A, and the periods that the memories 11 and 12 are addressed overlap each other at the halves. Accordingly, the data $DAT1_0$, $DAT1_2$, ... and the data $DAT2_1$, $DAT2_3$, ... read out from the memories 11 and 12 overlap each other.

The read select signal RS as shown in FIG. 8G is inputted to the data multiplexer 26. When this signal RS becomes high in level, the multiplexer 26 selects the data $DAT1_0$ produced from the memory 11, as shown in FIG. 8E. Then, when the signal RS is inverted in level, the multiplexer 26 selects the data $DAT2_1$ produced from the memory 12 as shown in FIG. 8H. In accordance with the level of the signal RS, the data multiplexer 26 successively selects the data continuously outputted from the memories 11 and 12. If the period following the time that the read select signal becomes high in level is made to coincide with the read cycle time, the data may be read out from both the memories 11 and 12 during the read cycle time $t_{RC}$. Therefore, the data read out for one read cycle is double that of a conventional memory device. In other words, the read cycle time is improved to be one-half that of a conventional memory device.

Figure 9:
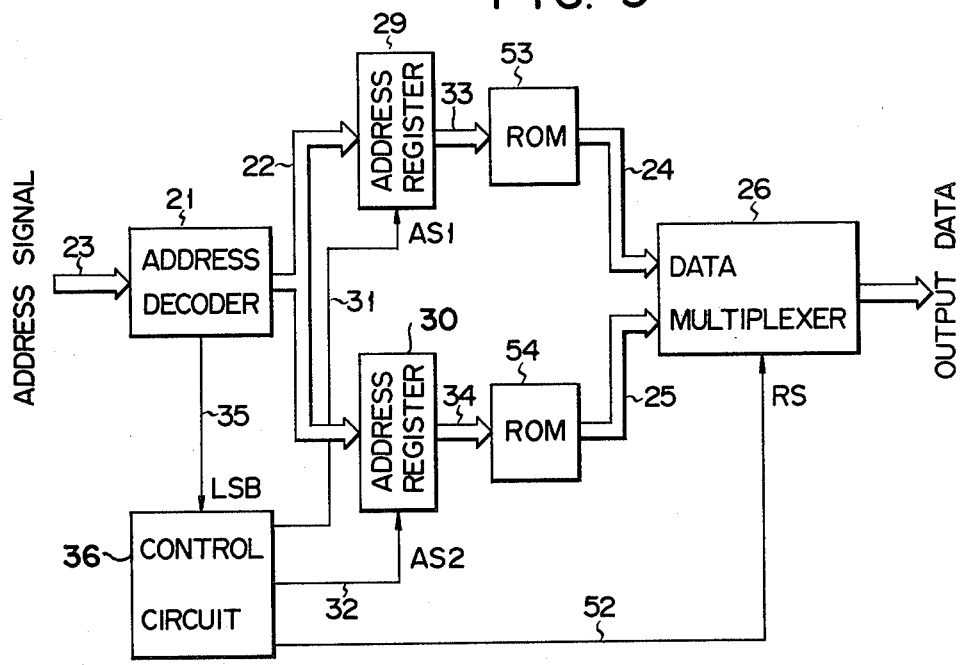
FIG. 9 shows a block diagram of a modification of the embodiment shown in FIG. 5.

FIG. 9 shows a modification of the embodiment shown in FIG. 5. The difference of this embodiment from the FIG. 5 embodiment is that read only memories (ROMs) are used for the memories 11 and 12, in place of the random access memories. In this embodiment, there is no need for the input data bus 17 and the data buffer registers 13 and 14, as in the embodiment shown in FIG. 4. The write enable signals WE1 and WE2 are also unnecessary. Since the data is only read out from the ROMs 53 and 54, the read cycle time may be substantially shortened by one half, compared to that of the conventional memory device. Therefore, memories with relatively long cycle times and thus with inexpensive cost may be used for the ROMs 53 and 54.

In the embodiments heretofore described, the even and odd addresses are previously allocated for the memories 11 and 12, respectively. In an alternative embodiment, the low portion addresses ranging from address 0 to address n−1 are allocated for the memory 11 while the high portion address ranging from addresses n to n−1 for the memory 12. In this case, the address register 29 holds the low portion address and the address register 30 holds the high portion address.

The number of the memories is not limited to two as in the above-mentioned embodiments. When more than two memories are used, the cycle time is further shortened with a further cost reduction. Core memories may be used for both the RAMs and ROMs.

Figure 10:
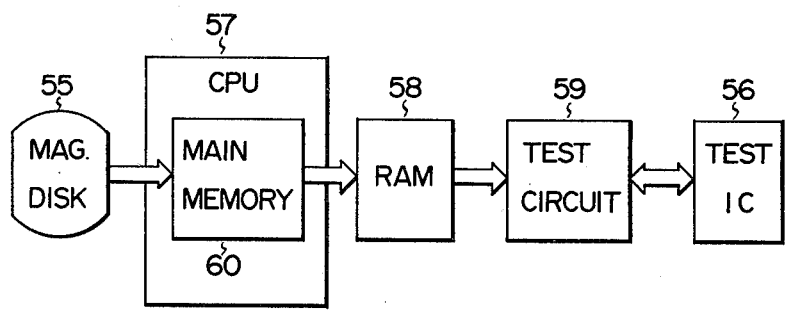
FIG. 10 shows a block diagram of a usual IC tester.

FIG. 10 shows a general construction of a typical LSI tester. In the figure, a magnetic disc 55 stores all the input test information necessary for testing an integrated circuit (or LSI) 56 including the expected value information, and produces the necessary information under control of a central processing unit (CPU) 57 when the test is executed. The information read out from the magnetic disc 55 is transferred to the CPU 57 and is stored in a main memory 60 in the CPU 57. A part of the information stored in the main memory 60 is also stored in a test pattern memory 58. The information stored in the test pattern memory 58 is supplied through a test circuit 59 including a judgement circuit to the integrated circuit 56 where the integrated circuit 56 is tested. After all the information previously stored in the test pattern 58 are read out, the information is read out from the magnetic disc 55 again and the read out information is transferred to the test pattern memory 58 through the CPU 57. Similarly, after all the information stored in the test pattern memory 58 are again read out, the information are supplied from the magnetic disc 55 to the test pattern memory 58 and then are sequentially supplied to the integrated circuit 56.

FIG. 11 shows a block diagram of a circuit when the memory device according to the invention is applied to the test pattern memory used in the embodiment shown in FIG. 10. In the figure, memories 61, 62 and 63 which are random access memories dividedly store all the input test information necessary for testing the function of the integrated circuit 56. The memories 61, 62, 63 also store the expected value information. Address data is applied from a control section 64 to the memories 61 to 63, through an address bus 65. By means of the address data, the same addresses of the memories 61 to 63 are specified. As a result of the addressing of those memories, the information previously stored in the memory locations are read out in parallel and are applied in parallel to a data multiplexer 66 through data buses 71 to 73. The control section 64 applies read select signals $RS_0$ and $RS_1$ to the data multiplexer 66 through control lines 67 and 68. In accordance with the level states of the signals $RS_0$ and $RS_1$, the multiplexer 66 successively selects the data produced in parallel from the memories 61, 62 and 63 during a given period and applies the selected data into memories 69 and 70. The memories 69, 70 are random access memories like the memories 61 to 63. The data multiplexer 66 thus serves as a parallel-to-serial converter for converting the three parallel data into serial data. The two memories 69 and 70, which are generally called test pattern memories, are operable at high speed, e.g. 3 MHz. The memories 69 and 70 have each a memory capacity approximately from 1,000 to 4,000 patterns, as in the case of conventional memories.

When receiving the write enable signals $WE_a$ and $WE_b$ fed from the control section 64 through the control lines 75 and 76 and write address data ADRW fed through the address bus 77 from the same, the memories 69 and 70 sequentially store the data from the data multiplexer 66 into the memory locations specified by the address data ADRW. When receiving the read address data ADRR coming through the address bus 78, the memories 69 and 70 produce the data previously stored in the memory locations specified by the address data ADRR applied thereto.

When the write address data ADRW and the read address data ADRR are both applied to the memories 69 and 70 simultaneously, if the write enable signals $WE_a$ and $WE_b$ have been applied to the memories, the write address data ADRW is used prior to the read address data ADDR. If the control signals $WE_a$ and $WE_b$ are not applied thereto, the read address data ADRR is used prior to the write address data ADRW. The data read out from the memories 69 and 70 are inputted in parallel to the switching circuit 79 through the data buses 80 and 81.

In accordance with a level state of the select signal SL outputted from the control section through the control line 82, the switching circuit 79 selects the data fed from the memory 69 or the memory 70. The data produced from the switching circuit 79 is applied to the test circuit 59 including a judgement circuit through the data bus 83.

The test circuit 59 discriminates between the input test information and the expected value information and applies only the input information to the integrated circuit 56 through the data bus 85. Further, the test circuit compares the information outputted from the integrated circuit 56 with the expected value information to judge if the integrated circuit is GO or NO GO.

Figure 12:
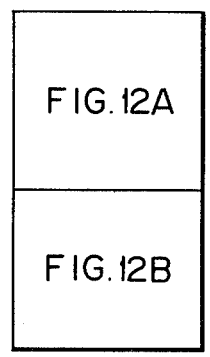
FIGS. 12A and 12B together show a circuit diagram of the control section used in the embodiment shown in FIG. 11.
FIG. 12C shows how FIGS. 12A and 12B relate to each other.
Figure 12A:
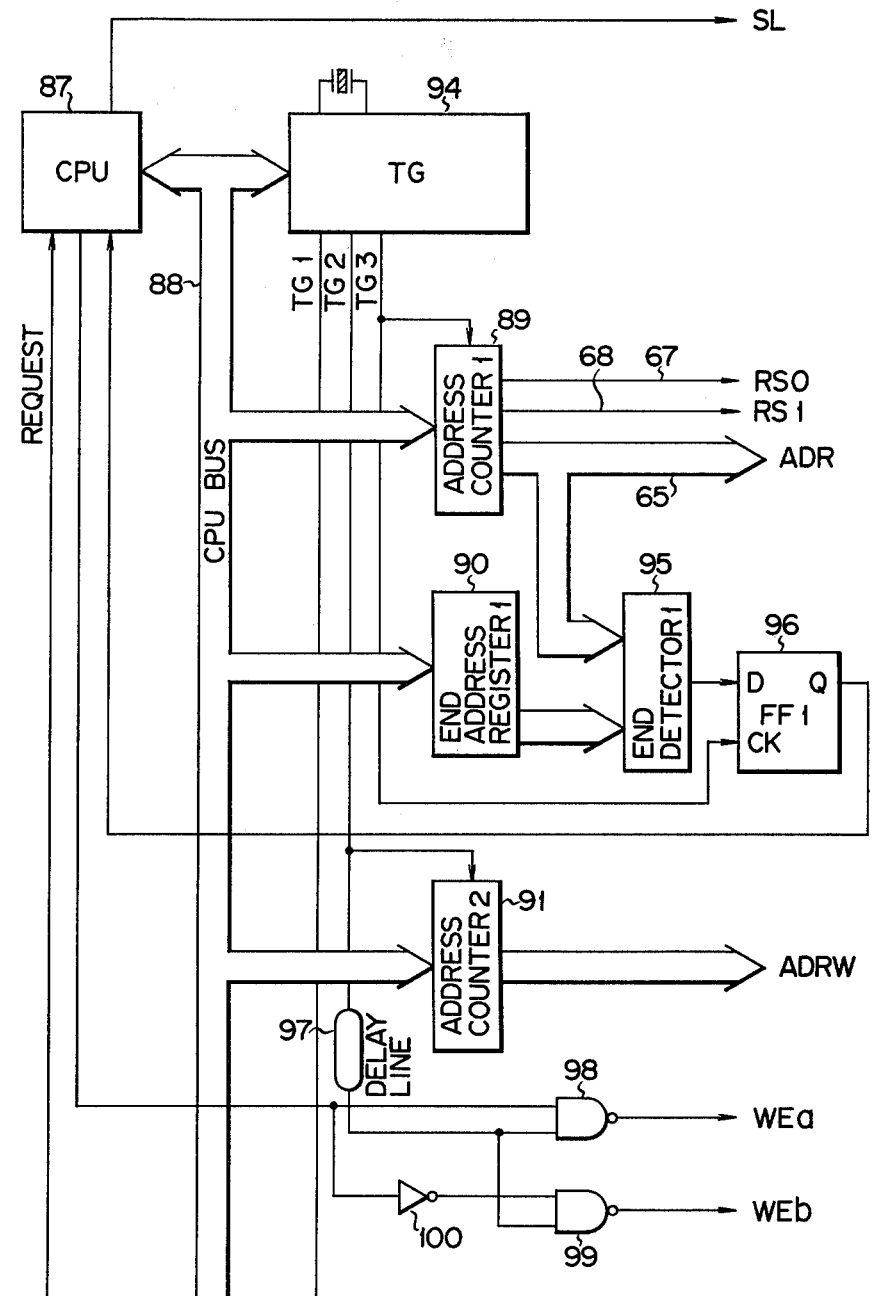
Figure 12B:
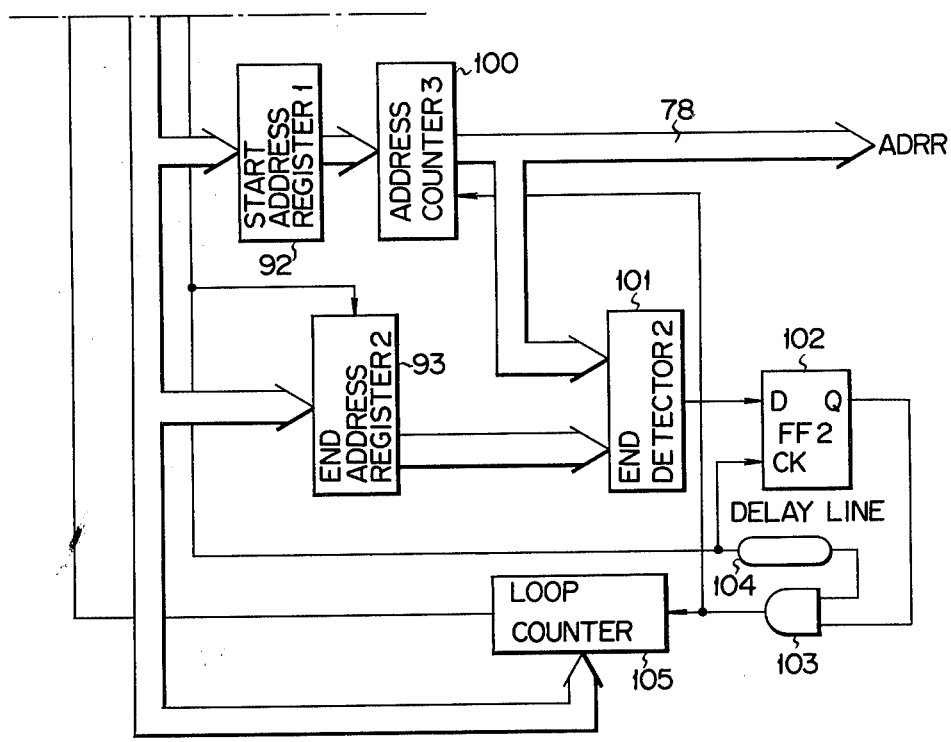

The control section 64 shown in FIGS. 12A and 12B will be described. The control section 64 includes a central processing unit 87. The CPU 87 is connected through a CPU bus 88 to an address counter 1 89, an end address register 1 90, an address counter 2 91, a start address register 1 92, and an end address register 2 93. When data is read out from the memories 61 to 63 and is to be written into the memories 69 and 70, the start address data to be read out from the memories 61 to 63 is set into the address counter 1 89 by the CPU 87. The CPU 87 also supplies the end address data into the end address register 1 90.

The address counter 1 89 counts the address data in response to a timing signal TG3 outputted from a timing generator 94, and further produces read select signals $RS_0$ to $RS_1$. The address data outputted from the address counter 1 89 is applied to an end detector 1 95, together with the end address outputted from the end address register 1 90. The end detector 1 95, which is comprised of a plurality of digital comparators, for example, compares the address data from the address counter 1 89 with the address data from the end address register 1 90, and produces a coincident signal when those address data are coincident with each other. The coincident signal from the end detector 1 95 is latched by a D-type flip-flop 96 and the latched signal is produced at the timing of the signal TG3.

The address data to write the data read out from the memories 61 to 63 into the memories 69 and 70 are supplied from the CPU to the address counter 2 91, by way of the CPU bus 88. The address counter 2 91, which has substantially the same construction as that of the address counter 1 89, counts the address data and produces the incremented data in response to the timing signal TG2.

The timing signal TG2 is applied to one of the input terminals of each of NAND circuits 98 and 99 through a delay line 47. A control signal from the CPU is applied to the output input terminals of the NAND gates. Accordingly, the NAND circuit 98 produces a write enable signal $WE_a$ in response to the control signal from the CPU 87. The CPU 87 supplies a control signal to the other input terminal of the NAND gate 99 through an inverter 100. Accordingly, the NAND circuit 99 produces a write enable signal $WE_b$.

When the data are read out from the memories 69 and 70, the start address data to be read out is loaded from the CPU 87 to the start address register 92 through the CPU bus 88. The start address register 1 92 temporarily holds the start address data and then supplies the data held into an address counter 3 100. The address counter 3 100 supplies the address data supplied thereto to an address bus 78 while at the same time incrementing the address value. The address data counted is supplied to an end detector 2 101, together with the end address held in the end address register 2 93. Like the end detector 2 101, the end detector 1 95 is comprised of a plurality of digital comparators, and compares the address data counted with the end address data. When both the data are coincident with each other, the end detector 195 produces a coincident signal. The coincident signal is supplied to a D-type flip-flop 102 where it is latched and then is applied to one of the input terminals of the AND circuit 103.

A timing signal TG1 from the timing generator 94 is applied to the other input terminal of the AND circuit 103 through a delay line 104. In response to the timing signal TG1, the coincident detected signal is applied to a loop counter 105. The number of loops to be performed is previously stored in the loop counter 105 through the CPU bus 88, from the CPU 87. Every time that the output signal from the AND gate 103 is applied to the loop counter 105, the loop counter 105 decrements the contents of the counter and produces a read end signal when the contents of the counter become zero. This condition is indicated to the CPU 87.

Figure 13:
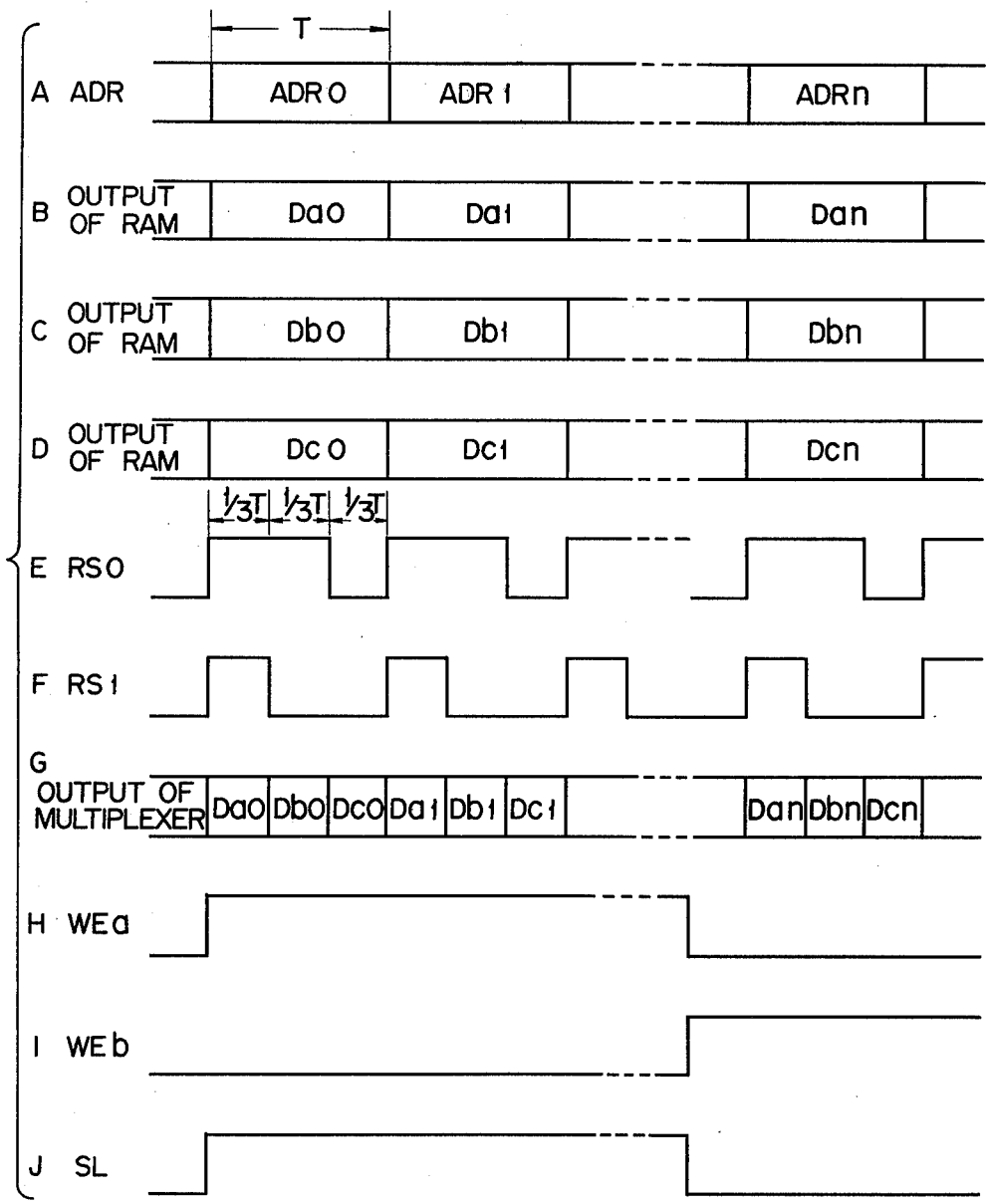
FIG. 13, consisting of A-J, shows timing charts for illustrating the operation of the embodiment shown in FIG. 11.

The operation of the control section 64 thus constructed will be described with reference to the timing charts shown in FIG. 13.

The control section 64 produces the address data $ADR_0$ to specify address 0 for each of the memories 61, 62 and 63 during a period T. Upon the application thereto of the address data $ADR_0$, the memories 61 to 63 produce the data $D_{a0}$ to $D_{c0}$ previously stored in the memory locations of the addresses 0. The memories 61 to 63 produce the data specified immediately after the address data is applied thereto, as shown in FIGS. 13B to 13D.

As shown in FIGS. 13E and 13F, the control section 64 keeps the read select signals $RS_0$ and $RS_1$ at a high level during the first $\frac{1}{3}$ period of the output period T of the address data $ADR_0$. During the first $\frac{1}{3}$ period, the data multiplexer 66 selects the data $D_{a0}$ outputted from the memory 61, as shown in FIG. 13G. Following this period, the control section 64 keeps the read select signals $RS_0$ and $RS_1$ in high and low level states, respectively, during the second $\frac{1}{3}$ period, as shown in FIGS. 13E and 13F. During the second $\frac{1}{3}$ period, the data multiplexer 66 selects the data $D_{b0}$ outputted from the memory 62, as shown in FIG. 13G. After the second $\frac{1}{3}$ period, the control section 64 keeps the read select signals $RS_0$ and $RS_1$ in low level state during the $\frac{1}{3}$ period succeeding to the second $\frac{1}{3}$ period. During the third $\frac{1}{3}$ period, the data multiplexer 13 selects the data $D_{c0}$ from the memory 63, as shown in FIG. 13G.

After the address data $ADR_0$ is inputted to the data multiplexer 66, the multiplexer 66 successively selects the address and produces data $D_{a0}$ to $D_{c0}$ at the speed (3 MHz) which is three times the operating speed (1MHz) of the memories 61 to 63. At this time, if the control section 64 keeps the write enable signal $WE_a$ at a high level, as shown in FIG. 13H, the memory 69 stores the data $D_{a0}$ to $D_{c0}$ in response to the write address data ADRW from the control section 64. Subsequently, the memories 61 to 63 receive the address data ADR and read out the data specified by the address data received. Further, those memories receive the address data ADRW and write the data produced sequentially from the data multiplexer 66 at the speed of 3 MHz in the memory locations specified by the address data ADRW.

After the data are loaded into all the memory locations of the memory 69, the control section 64 inverts the level of the write enable signal $WE_a$, thus far kept at a high level into the low level. At the same time, the same keeps the write enable signal $WE_b$ at a high level. With the high level of the write enable signal $WE_b$, the memory 70 successively stores at the speed of 3 MHz the data outputted from the data multiplexer 66 in response to the write address data ADRW outputted from the control section 64.

During the period that the memory 70 stores the data, the memory 69 reads out at the speed of 3 MHz the data previously stored therein in accordance with the address data ADRR derived from the control section 64. In this case, if the memories 69 and 70 have the same memory capacities, the data reading operation from the memory 69 and the data write operation into the memory 70, are completed at the same time.

Following those operations of the memories 69 and 70, the control section 64 inverts the level state of the write enable signal $WE_a$ into the high level and further the level state of the write enable signal $WE_b$ into the low level. The control section 64 further produces the write address data ADRW and the read address data ADRW to the memories 69 and 70.

Subsequently, the control section 64 inverts the level states of the write enable signals $WE_a$ and $WE_b$ every time that the data write operation to all the memory locations of each memory 69 and 70 or the data read operation from all the memory locations is completed. Further, the control section 64 keeps the select signal SL in a high level during the period that the data is read out from the memory 69. The same keeps the select signal SL in low level during the period that data is read out from the memory 70. Then, the switching circuit 79 selects the data produced from the memory when the select signal SL is in high level. The same selects the data from the memory 70 when the select signal SL is in the low level. Accordingly, the switching circuit 79 successively produces the data stored in the memories 61 to 63 in the divided manner at the speed of 3 MHz. Therefore, the switching circuit 79 produces the input test information to the integrated circuit 86 at the speed of 3 MHz, through the test circuit 59.

The embodiment as mentioned above is provided with two memories 69 and 70 and reads out the data from one of the memories and supplies the read-out data to the integrated circuit while at the same time it writes the data into the other memory at the same speed. Accordingly, the input test information may be supplied to the integrated circuit 86 continuously. The data supply speed at this time is based on the operating speed of the memory. However, this speed is 3 MHz and very high, so that the data may be supplied for a short time. The data previously stored in the memories 61 to 63 are read out therefrom at the speed of 1 MHz and the data multiplexer 66 produces the data at the speed of 3 MHz. Accordingly, memories with low operation speeds may be used for the memories 61 to 63. The random access memory with a low operation speed may easily be designed to have a large memory capacity approximate to that of the magnetic disc memory.

Although the above-mentioned embodiment employs three memories, more than three memories may also be used in the invention. When the increased number of memories is used, the correspondingly increased amount of the information may be supplied to the integrated circuit. In the above-mentioned embodiment, the address operations performed by the data write and the data read are different with the use of the write address data ADRW and the read address data ADRR for the memories 69 and 70. However, the addressing for the memories 69 and 70 may be made by a single address. The test circuit 59 and the circuit 56 to be tested with supplied information may be replaced by any other electronic circuit.

What is claimed is:

1. A memory device for receiving, storing, and outputting data groups, said memory device comprising:
   a plurality of registers, each of said registers for receiving and storing a data group and for outputting a said stored data group following the storing thereof;
   a pluarlity of memory means for addressably storing and outputting data groups, each of said memory means having individually addressable memory locations and each memory means being associated with a different one of said registers for receiving said data groups outputted by said associated register;
   address control means for supplying in parallel the same address information to each of said memory means to cause each of said memory means to output the data groups stored in the individually addressable memory locations designated by said supplied address information; and
   parallel-to-serial converting means coupled to said plurality of memory means for receiving data groups outputted therefrom and for selectively supplying said received data groups in a serial manner.

2. A memory device according to claim 1 wherein each of said memory means is a random access memory.

3. A memory device for outputting previously stored data groups comprising:
   a plurality of memory means having individually addressable memory locations for addressably storing data groups and for outputting said stored data groups;
   address control means for supplying in parallel the same address information to each of said memory means to cause each of said memory means to output the data group stored in the individually addressable memory location designated by said supplied address information; and
   parallel-to-serial converting means coupled to said plurality of said memory means for receiving data groups outputted therefrom and for selectively supplying said received data groups in a serial manner.

4. A memory device according to claim 3 wherein each of said memory means is a read-only memory.

5. A memory device for receiving and storing data groups when operated in a write mode and for outputting stored data groups when operated in a read mode, the memory device comprising:
   a plurality of registers, each of said registers for receiving and storing a data group and for outputting a said stored data group following the storing thereof;
   a plurality of memory means having individually addressable memory locations for addressably storing and outputting data groups, each of said memory means being associated with a different one of said registers for receiving said data groups outputted by said associated register;
   means for selectively supplying addresses in said memory means;
   a plurality of address registers coupled to said supplying means for receiving said supplied addresses, each of said address registers being associated with a different one of said memory means; and
   parallel-to-serial converting means for receiving said data groups outputted from said memory means and for selectively supplying said received data groups in a serial manner.

6. A memory device according to claim 5 wherein each of said memory means comprises a random access memory.

7. A memory device for outputting data groups stored therein, the memory device comprising:
   a plurality of memory means for addressably storing said data groups and for outputting addressed data groups;
   means for supplying addresses in said memory means;
   a plurality of address registers coupled to said supplying means for receiving said supplied addresses, each of said address registers being associated with a different one of said memory means;
   control means for (1) generating address enable signals and selectively supplying said address enable signals to said address registers to enable the storing of said supplied addresses in selected address register, and (2) generating read enable signals to control said memory means associated with a said selected address register to output a said data group stored at the address stored in said selected address register; and
   parallel-to-serial converting means for receiving said data groups outputted from said memory means and for selectively supplying said received data groups in a serial manner.

8. A memory device according to claim 7 wherein each of said memory means comprises a read only memory.

9. A memory device comprising:
   a plurality of first memory means for addressably storing data groups and for outputting said data groups when addressed;
   means for selectively addressing each of said first memory means and for controlling said addressed first memory means to output in parallel said data groups stored at first selected addresses, said first selected addresses each being associated with an individual one of the memory means;
   parallel-to-serial converting means coupled to said plurality of memory means for receiving said outputted data groups and for selectively supplying said received data groups in a serial manner;
   first and second high speed memory means coupled to said parallel-to-said converting means for receiving and addressably storing said data groups outputted by said parallel-to-serial converting means and for outputting data groups stored therein when addressed;
   memory control means coupled to said first and second high speed memory means and operating in a first mode to (1) control said first high speed memory means to store at a second selected address a said data group outputted by said serial-to-parallel converting means and (2) control said second high speed memory means to output a said data group stored at a third selected address, or a second mode to (1) control said second high speed memory means to store at the second selected address a said data group outputted by said serial-to-parallel converting means and (2) control said first high speed memory means to output a said data group stored at said third selected address; and switching circuit means coupled to said first high speed memory means and said second high speed memory means for receiving said data groups outputted therefrom and for selectively supplying said received data groups in a serial manner.

10. A memory device according to claim 9 wherein said first high speed memory means and said second high speed memory means comprise random access memories.

* * * * *